United States Patent [19]

Weller et al.

[11] 4,303,892

[45] Dec. 1, 1981

[54] UNCONDITIONALLY STABILIZED MICROWAVE TRANSISTOR AMPLIFIER

[75] Inventors: Carroll E. Weller, Cincinnati, Ohio; Thomas J. Woodruff, Fort Thomas, Ky.

[73] Assignee: Cincinnati Electronics Corporation, Cincinnati, Ohio

[21] Appl. No.: 81,143

[22] Filed: Oct. 2, 1979

[51] Int. Cl.³ .............................................. H03F 3/60
[52] U.S. Cl. ..................................... 330/286; 330/53
[58] Field of Search .................. 330/53, 286; 333/204; 357/72, 74, 75

[56] References Cited

U.S. PATENT DOCUMENTS 3,857,106 12/1974 Seidel .................................. 330/286
3,936,864 2/1976 Benjamin .............................. 357/72

OTHER PUBLICATIONS

Hejhill, R., "RF Small Signal Design Using Two-Port Parameters", *Motorola Application*, Note 215A, 1967.
Rollett, J. M., "Stability and Power-Gain Invariants of Linear Two Ports", *IRE Trans. Ckt. Theory*, vol. CT-9, Mar. 1962, pp. 29-32.
"S-Parameters . . . Circuit Analysis and Design", *Hewlett Packard Application*, Note 95, Sep. 1968.

Linvill et al., "The Design of Tetrode Transistor Amplifiers", *BSTJ*, vol. 35, Jul. 19 56, pp. 813-840.
"Using Linvill Techniques for *RF Amplifiers*", *Motorola Application Note Number* 166, 1967.
Stern, A. P., "Stability and Power Gain of Tuned Transistor Amplifiers", *Proc. I.R.E.*, vol. 45, Mar. 1957, pp. 335-343.
Ghausi, M. S., *Principles and Design of Linear Active Circuits*, McGraw-Hill, pp. 467-473.

*Primary Examiner*—Alfred E. Smith
*Assistant Examiner*—T. N. Grigsby
*Attorney, Agent, or Firm*—Lowe, King, Price & Becker

[57] ABSTRACT

Input and output electrodes of a microwave, active semiconductor amplifying element are shunted to ground by resistive means having values selected to assure unconditional stability of the semiconductor amplifying element. The resistive means and active element are located in a common semiconductor package having three output terminals respectively connected to input, output and common electrodes of the amplifying element. The resistive means includes, in certain embodiments, first and second resistors respectively shunting the input and common electrodes and output and common electrodes, with values respectively selected to provide relatively high efficiency and low noise characteristics for the amplifying element.

21 Claims, 6 Drawing Figures

UNCONDITIONALLY STABILIZED MICROWAVE TRANSISTOR AMPLIFIER

TECHNICAL FIELD

The present invention relates generally to microwave semiconductor amplifiers, and more particularly to a microwave semiconductor amplifier having input and output electrodes shunted to a common electrode by resistive means having values selected to provide unconditional stability.

BACKGROUND ART

Semiconductor amplifying elements, such as bipolar and field effect transistors, adapted for microwave frequencies, in the range of 200 megahertz to 2 gigahertz, are inherently unstable over at least a portion of the normal useful frequency band thereof because they have high gain and parasitic feedback impedances. Typically, such microwave amplifying elements are connected to a microwave source by a first tuned impedance, and to a microwave load through a second tuned impedance. For efficiency purposes, it is desirable for the first tuned circuit to provide matching between the microwave source and input and common terminals of the amplifier, and for the second tuned circuit to provide matching between the load and output and common terminals of the transistor amplifying element. In the past, however, providing such matching networks has been done at the sacrifice of stability to the amplifier over at least a portion of its desired operating range. Hence, to provide stability, it has frequently been the practice to selectively mismatch the source and/or load to the input, output and common electrodes of the amplifying element. It has been found that such selective mismatching, in addition to decreasing the amplifier efficiency, has the further disadvantage of providing voltage standing-wave ratio changes to the input and output electrodes of the amplifier sufficient to cause oscillations and, therefore, instability over at least a portion of the amplifier frequency range.

The mismatch concept is basically discussed in:
- *BSTJ*, Volume 35, pages 813–40, July 1956, J. G. Linvill et al, article entitled "The Design Of Tetrode Transistor Amplifiers;"
- the book *Transistors And Active Circuits*, published by McGraw-Hill, 1960, written by J. G. Linvill et al; and
- *Motorola Application Note Number 166*, 1967, entitled "Using Linvill Techniques For RF Amplifiers," written by P. M. Norris.

In accordance with another technique, attempts to stabilize microwave, semiconductor amplifiers are made by mismatching source and load impedances by conductive loading. This technique, known as Stern's stability method, is reported in:
- *Proceedings Of The Institute of Radio Engineers*, Volume 45, pages 335–343, March 1957, in an article entitled "Stability And Power Gain Of Tuned Transistor Amplifiers," written by A. P. Stern;
- the book *Principles And Design Of Linear Active Circuits*, published by McGraw-Hill, 1965, written by M. S. Ghausi; and
- Motorola Technical Application Note 215, 1967, entitled "RF Small Signal Design Using Admittance Parameters" written by R. Hejhill.

The Stern's stabilization method achieves network stabilization by mismatching the source and load impedances at the expense of amplifier gain. If a semiconductor, microwave amplifier element is potentially unstable, source and load admittances can be selected to insure unconditional stability of the amplifier device. An amplifier element is defined as being unconditionally stable if no combination of passive source or load impedances can be found which causes the device to oscillate. Stated differently, an unconditionally stable transistor network cannot be made to oscillate with any combination of load and source impedances without the application of external feedback. A linear two-port device, such as a microwave transistor amplifier element, is unconditionally stable if the real part of the impedance or admittance looking into either the input or output port of the device is positive for any passive termination of the other port. A linear two-port device is conditionally stable, i.e., potentially unstable, if the real part of the impedance or admittance looking into either the input or output port of the device is positive for some, but not all, passive terminations of the other port. If the real part of the impedance looking into a port is positive, the magnitude of the reflection coefficient looking into that port must be less than 1, i.e., the reflection coefficient must remain on a Smith chart. A linear two-port device, such as a class A linear microwave transistor amplifier, is therefore unconditionally stable if the reflection coefficients for the input and output terminals of the device, as mapped on a Smith chart, lie on the Smith chart for any value of passive load or source impedance. A linear two-port device is conditionally stable if the reflection coefficients looking into input and output terminals of the device lie on the Smith chart for only some values of load or source impedance, and lie off of the Smith chart for other values of load or source impedance.

Amplifiers designed in accordance with Stern's Stabilization Method, in addition to having relatively poor gain properties, are not always stable. In particular, in one device that was theoretically calculated utilizing a Hewlett Packard HXTR-6101 common emitter microwave transistor operating at one gigahertz it was found that there was conditional stability for source and load impedances of 50 ohms each, shunt input and output reactances of 4.127 and 4.37 millimhos, respectively, and perfect matching transformers having turns ratios of 3.96:1 and 7.34:1 between the source and input and between the load and output of the amplifying device, respectively.

In addition to the aforementioned disadvantages, Stern's stabilization method requires the use of one or more padding resistors external to a package in which the active semiconductor amplifying element is located. External resistors to the semiconductor amplifying element package increase the values of parasitic reactive components, particularly inductance, due to lead lengths. Of course, changing the parasitic reactance associated with the amplifying element has a change and substantial effect on the characteristics of a microwave device, so that the microwave semiconductor amplifier is not likely to operate in accordance with its theoretical, calculated performance. In addition, in the Stern's stabilization method, the value of a padding resistor or resistors is selected somewhat arbitrarily and then verified either empirically or iteratively with the use of a computer analysis. Such procedures increase the design time and prevent optimum stability and gain performance.

Rollett has reported a precise, mathematical stability factor related to the admittance parameters of a two-port device, such as a linear transistor microwave amplifier. Rollett's stability factor is reported in *The Institute Of Radio Engineers' Transactions On Circuit Theory*, CT-9, pages 24–32, March 1962, in an article entitled "Stability And Power Gain In Variance Of Linear Two-Ports." Rollett's stability factor, K, can be expressed as:

$$K = \frac{2g_{11}g_{22} - Re(y_{12}y_{21})}{|y_{12}y_{21}|} \quad (1)$$

where
  $g_{11}$ = the conductance between input and common terminals of the device,
  $g_{22}$ = the conductance between the output and common electrodes of the device,
  Re = real component,
  $y_{21}$ = forward transfer admittance of the device from the input to the output electrodes thereof, and
  $y_{12}$ = reverse transfer admittance of the device from the output to the input electrodes thereof.

If the value of K is greater than 1, the device is unconditionally stable. If the value of K is less than 1, the device is conditionally stable, and therefore subject to oscillation under certain load conditions. Of course, load conditions can vary in a real device; for instance, if the load is an antenna, weather and/or proximity of the antenna to other structures change the load impedance.

Rollett's stability factor can be rewritten in terms of s-parameters, which are reflection and transmission coefficients directly related to voltage standing-wave ratios and impedances, particularly of microwave semiconductor amplifying devices operating under linear conditions. As described in *Hewlett Packard Application Note 95* entitled "S-Parameters ... Circuit Analysis and Design," published September 1968, s-parameters are vector quantities providing magnitude and phase information. Two-port s-parameters are easy to measure at high frequencies because a device under test is terminated in the characteristic impedance of a measuring system for the device. A two-port device can be defined by four s-parameters, $s_{11}$, $s_{22}$, $s_{12}$, $s_{21}$; $s_{11}$ and $s_{22}$ are input and output reflection coefficients of the two-port device; $s_{12}$ and $s_{21}$ are respectively the reverse and forward transmission coefficients of the device whereby $|s_{12}|^2$ and $|s_{21}|^2$ are respectively reverse and forward power gains of the device and $\angle s_{12}$ and $\angle s_{21}$ are respectively reverse and forward insertion phase shifts of the device. Because admittance (y, g and b) parameters can be transformed into scattering (s) parameters, Rollett's stability factor can be rewritten as:

$$K = \frac{1 + |D|^2 - |s_{11}|^2 - |s_{22}|^2}{2|s_{12}s_{21}|} \quad (2)$$

where
  $D = s_{11}s_{22} - s_{12}s_{21}$.

Rollett extended the stability factor relationship as a function of admittance to include passive terminations connected in shunt with input and output ports of a transistor, i.e., to resistors in shunt between input and common electrodes of the transistor and between output and common electrodes of the transistor. In such a case Equation (1) can be rewritten as:

$$K = \frac{2(G_{11} + g_{11})(G_{22} + g_{22}) - Re(y_{12}y_{21})}{|y_{12}y_{21}|} \quad (3)$$

where
  $G_{11}$ = the shunt conductance between the transistor input and common electrodes; and
  $G_{22}$ = the shunt conductance between the transistor output and common electrodes.

DISCLOSURE OF THE INVENTION

The present invention utilizes the Rollett stability factor to assure unconditional stability of a microwave, semiconductor two-port amplifying element having tuned, matching input and output networks. Unconditional stability is attained by selecting the proper values of resistive means between the input and output electrodes of the element and a common electrode of the element to assure that K is greater than 1. If the input and common electrodes are shunted by a resistor $R_1$ and the output and common electrodes are shunted by a resistor $R_2$, the stability factor is determined as:

$$K = \frac{\left(\frac{1}{R_1} + g_{11}\right)\left(\frac{1}{R_2} + g_{22}\right) - Re(y_{12}y_{21})}{|y_{12}y_{21}|} \quad (4)$$

Plots can be made of K versus $R_1$ and/or $R_2$, for various ratios $R_2:R_1$, to enable the proper combination of shunt resistances to be selected to achieve a certain stability factor for the network. Of course, the value of K must exceed unity to provide an unconditionally stable network. The value of K is also a determining factor in the gain of the network. For any network, the maximum available $G_{AMAX}$ is a function of the network stability factor K and the maximum stable gain MSG of the network in accordance with:

$$G_{AMAX} = (MSG)|K_R - \sqrt{K_R^2 - 1}| \quad (5)$$

Maximum stable gain can be written in y and s-parameter terms in accordance with:

$$MSG = \left|\frac{y_{21}}{y_{12}}\right| = \left|\frac{s_{21}}{s_{12}}\right| \quad (6)$$

After calculating the maximum stable gain (MSG) of the device, the desired gain is achieved by choosing a proper combination of $R_1$ and $R_2$ which enables the network to have a stability factor (K) and $G_{AMAX}$ to equal the desired gain.

If it is desired for the device to have low noise properties, the value of $R_2$ is selected to be finite, while the value of $R_1$ is infinite, i.e., $R_1$ is an open circuit. If efficiency is the prime design criterion, a finite value for $R_1$ is selected and $R_2$ is an open circuit. If a compromise between noise properties and efficiency is desired, both $R_1$ and $R_2$ are selected to have finite values.

After the values of $R_1$ and $R_2$ have been selected, the s-parameters of the semiconductor, microwave transistors are converted into s-parameters of a device including the resistors that shunt the input and output electrodes of the amplifier element. Then, the impedances of the input and output tuned matching networks to the source and load are calculated in accordance with:

$$Z_{IN} = \frac{Z_0(1 + \Gamma \text{ in})}{1 - \Gamma \text{ in}} \quad Z_{OUT} = \frac{Z_0(1 + \Gamma \text{ out})}{1 - \Gamma \text{ out}} \quad (7)$$

where
$Z_0$ = the characteristic impedance of the first matching network = the characteristic impedance of the second matching network, $$\Gamma_{IN} = C_1^* \left[ \frac{B_1 - \sqrt{B_1^2 - 4|C_1|^2}}{2|C_1|^2} \right] \quad (8)$$

$$\Gamma_{OUT} = C_2^* \left[ \frac{B_2 - \sqrt{B_2^2 - 4|C_2|^2}}{2|C_2|^2} \right]$$

$C_1 = S_{11} - DS_{22}^*$ $C_2 = S_{22} - DS_{11}^*$ $D = S_{11}S_{22} - S_{12}S_{21}$ $B_1 = 1 + |S_{11}|^2 - |S_{22}|^2 - |D|^2$ $B_2 = 1 + |S_{22}|^2 - |S_{11}|^2 - |D|^2$ $C_1^*$ and $C_2^*$ are respectively complex conjugates of $C_1$ and $C_2$ $S_{11}^*$ and $S_{22}^*$ are respectively complex conjugates of $S_{11}$ and $S_{22}$ $S_{11}$ and $S_{22}$ are respectively reflection coefficients of the element and resistor means between the input and common electrodes and between the output and common electrodes $S_{12}$ and $S_{21}$ are respectively the reverse and forward transmission coefficients of the element and resistor means, whereby $|S_{12}|^2$ and $|S_{21}|^2$ are respectively reverse and forward insertion power gains of the element and resistor means, and $\angle S_{12}$ and $\angle S_{21}$ are respectively reverse and forward insertion phase shifts of the element and resistor means In accordance with one aspect of the invention, the shunt resistor or resistors is included in the same package as the microwave semiconducting amplifier in integrated circuit form. The integrated circuit is supplied to users with s-parameters including the shunt stabilizing resistor or resistors. Because the resistor is internal to the package, prior art problems associated with externally added resistors and parasitic impedances do not occur. It is possible to provide internal resistors in the present invention because the maximum stable gain of the microwave semiconductor transistor is not reduced with the addition of the internal stabilizing resistors. In fact, the useful gain of the device with the stabilizing resistors can be as high as the maximum stable gain of an unstabilized device.

A microwave transistor amplifier that is stabilized in accordance with the present invention can be used in design analyses that would not otherwise result in meaningful amplifier designs. The present invention also enables a transistor to be stabilized by loading either or both of its input or output ports. Thereby, an extra degree of freedom is attained in making loading compatible with the intended application, i.e., high efficiency or low noise.

By providing stabilizing resistors within the microwave semiconductor amplifier package. Stray inductance is minimized while providing internal stabilization because lead lengths of stabilizing resistors are much shorter than the situation which exists with the resistors outside of the transistor package. A potentially unstable amplifier cannot be experimentally tuned in a test fixture without some possibility of oscillations. Such oscillations cannot occur with the present invention because the transistor amplifying package is unconditionally stable, i.e., does not oscillate regardless of the stray impedances coupled between the input and common and output and common electrodes thereof.

It is, accordingly, an object of the present invention to provide a new and improved microwave semiconductor amplifier that is unconditionally stable and a method of designing such an amplifier.

Another object of the invention is to provide a microwave transistor amplifier package which is supplied to the user in such form that it is unconditionally stable.

A further object of the present invention is to provide a microwave transistor amplifier package having minimum stray inductance and which is internally stabilized.

A further object of the invention is to provide a microwave semiconductor amplifier package that cannot possibly oscillate, either in use or while being tuned in a test fixture, unless an external feedback impedance is connected between the input and output terminals thereof.

A further object of the invention is to provide a microwave transistor amplifier that is matched to its source and load, to provide maximum efficiency, and which is unconditionally stable, and a method of designing such an amplifier.

Another object of the invention is to provide a microwave amplifier that is unconditionally stable and has a useful gain equal to the maximum stable gain of the transistor element.

A further object of the invention is to provide a microwave semiconductor amplifier having unconditional stability and which can be loaded at either the input and/or output electrodes, to enable the amplifier to have optimum efficiency or noise characteristics, or a compromise between these two characteristics.

The above and still further objects, features and advantages of the present invention will become apparent upon consideration of the following detailed description of two specific embodiments thereof, especially when taken in conjunction with the appended drawings.

BEST MODE FOR CARRYING OUT THE INVENTION

Figure 1:
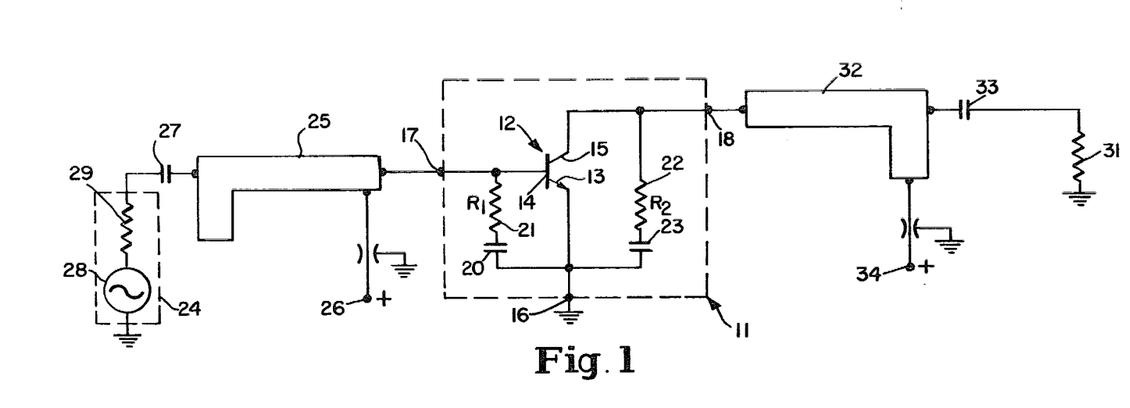
FIG. 1 is a circuit diagram of one embodiment of the invention, utilizing a bipolar common emitter transistor.

Reference is now made to FIG. 1 of the drawing wherein there is illustrated integrated circuit package 11 in which is included a bipolar NPN microwave transistor 12 connected in a common emitter configuration. Transistor 12 can be any suitable microwave transistor but in one preferred embodiment is a Hewlett Packard HXTR-6101. Transistor 12 includes emitter electrode 13, base electrode 14 and collector electrode 15, respectively connected to common terminal 16, input terminal 17 and output terminal terminal 18 of package 11. Shunting electrodes 13 and 14, within package 11, is a series circuit including capacitor 20 and resistor 21. A similar series circuit, within package 11, includes resistor 22 and capacitor 23 in shunt between electrodes 13 and 15. Resistors 21 and 22 have values $R_1$ and $R_2$, one of which may be infinity, selected in such a manner as to provide package 11 with unconditional stability over the normal operating frequency range of transistor 12. The values of resistors 21 and 22 are selected in such a manner as to maximize the gain of package 11 between input and output terminals 17 and 18. Capacitors 20 and 23 are blocking capacitors, to prevent the flow of DC bias currents through resistors 21 and 22 and in shunt with electrodes 13 and 14 and in shunt with electrodes 13 and 15, thereby to maximize efficiency of the device.

By encapsulating resistors 21 and 22 and capacitors 20 and 23 with transistor 12 in package 11, stray inductance for the circuit, including the stabilizing resistors, is minimized. Inductance is minimized because lead lengths of stabilizing resistors 21 and 22 are much shorter with the resistors inside of package 11 than if the resistors are external to the package.

Input terminal 17 is connected to microwave source 24 by a tuned matching network, preferably comprising strip line transmission line 25. One end of transmission line 25 is connected directly to input terminal 26. The other end of transmission line 25 is connected to one electrode of blocking capacitor 27 having a second electrode that is connected to source 24; source 24 is illustrated as including a voltage source 28, connected in series with resistor 29, which represents the source impedance.

Output terminal 18 is connected to load 31 by a tuned matching network which, in a preferred embodiment, comprises strip line transmission line 32. One terminal of transmission line 32 is connected directly to terminal 18, while a second terminal of the transmission line is connected to one electrode of DC blocking capacitor 33, having a second electrode connected to load 31. A positive DC bias voltage is applied by terminal 34 to collector 15 of transistor 12. Terminal 34 is connected to an arm of line 32 that extends to the side of the arm connected between terminal 18 and capacitor 33 and which is in proximity to the end of the latter arm.

It is to be understood that the active element in package 11 can be any suitable, two-port microwave device.

Figure 2:
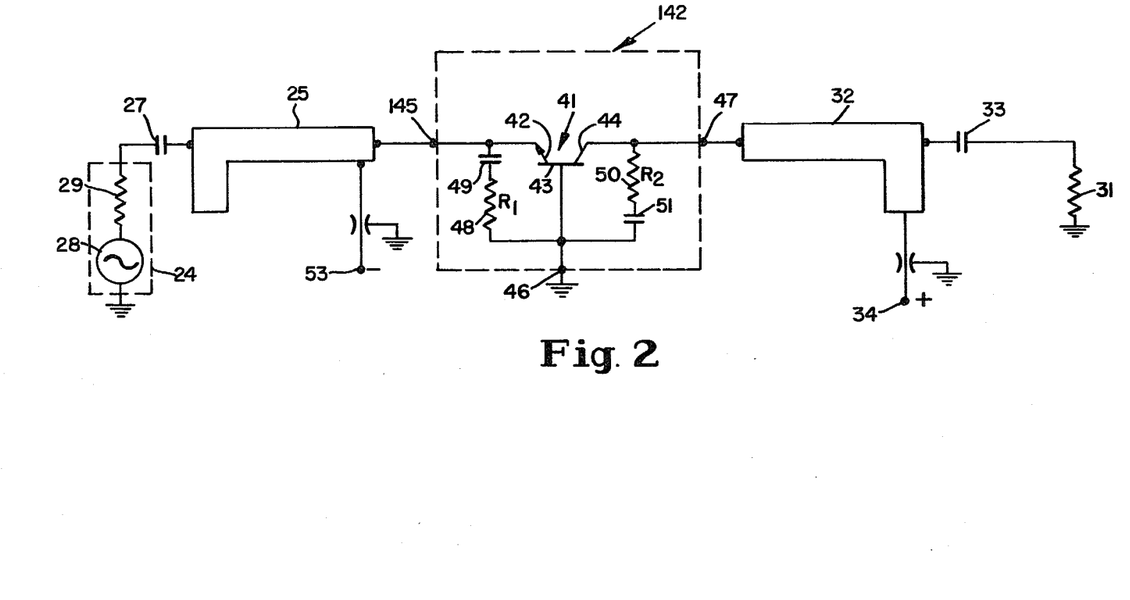
FIG. 2 is a circuit diagram of a second embodiment of the invention, utilizing a common base, bipolar transistor.

For example, in the embodiment illustrated in FIG. 2, bipolar, microwave transistor 41 is connected within package 142 in a common base configuration. To this end, emitter, base and collector electrodes 42, 43 and 44 of transistor 41 are respectively connected to input, common and output terminals 145, 46 and 47 of package 142. The emitter and base electrodes 42 and 43 of transistor 41, hence input and common terminals 145 and 46 of package 142, are shunted by a series circuit including stabilizing resistor 48 and DC blocking capacitor 49 in the same manner that capacitor 20 and resistor 21 shunt the base and emitter input and common terminals of the transistor amplifier of package 11 in FIG. 1. Similarly, collector 44 and base 43 of transistor 41, and thus output and common terminals 47 and 46 of package 142, are shunted by a series circuit including stabilizing resistor 50 and capacitor 51. Resistors 48 and 50, as well as capacitors 49 and 51, are encapsulated in package 142 with transistor 41.

The active elements 12 or 41 within the amplifier packages 11 or 142 can be field effect transistors of the type adapted for microwave operation. Regardless of the type of active element within the integrated circuit package, it is biased for class A, small signal, linear operation.

Bias of transistor 41 is achieved in a manner similar to that for transistor 12. In addition, matched input and output tuning networks are connected between source 24 and terminal 145, and between load 31 and terminal 47, in a manner similar to that described in connection with FIG. 1. The only significant difference is that a negative bias voltage is applied from terminal 53 through a DC circuit to terminal 145 and thence to emitter 42 in the circuit of FIG. 2. Of course, the impedance characteristics of the matched, tuned transmission lines in FIG. 2 differ from those of FIG. 1.

To achieve unconditional stability, the value of resistor 21 or 48 ($R_1$) and the value of resistor 22 or 50 ($R_2$) are related to the admittance parameters of transistor 12 or 41 in a manner that enables the Rollett stability factor to be greater than 1. The admittance parameters can be derived from the usually supplied scattering parameters, utilizing well known techniques. In particular, to achieve a Rollett stability factor of K greater than 1, K is selected so $$K = \frac{\left(\frac{1}{R_1} + G_{11}\right)\left(\frac{1}{R_2} + g_{22}\right) - Re(y_{12}y_{21})}{|y_{12}y_{21}|} \quad (9)$$

where:
  $g_{11}$ = the conductance seen looking between base 14 and emitter 13 or between emitter 42 and base 43;
  $g_{22}$ = the conductance seen looking into transistor 12 between collector 15 and emitter 13 or looking between the collector 44 and base 43 of transistor 41;
  Re = a real component
  $y_{21}$ = the forward, complex transfer admittance of transistor 12 between base 14 and collector 15 or between emitter 42 and collector 44 of transistor 41; and
  $y_{12}$ = the reverse transfer admittance of transistor 12 between collector 15 and base 14 or between collector 44 and emitter 42 of transistor 41.

If it is desired for the device to have optimum, i.e., low noise characteristics, the values of resistors 21 and 48 are infinite, whereby no circuit elements are connected between base 14 and emitter 13 or between emitter 42 and base 43. If, however, high efficiency is required for the device, the values of resistors 22 and 50 are selected to be infinite, in which case no circuit elements are connected between collector 15 and emitter 13 or between collector 44 and base 43. If a compromise is required between amplifier efficiency and noise characteristics, neither of the resistors shunting the input and output terminals of the amplifier packages 11 and 142 has an infinite value. If the output resistor $R_2$ has an infinite value, the stability factor is expressed as:

$$K = \frac{\left(\frac{1}{R_1} + g_{11}\right) g_{22} - Re(y_{12}y_{21})}{|y_{12}y_{21}|} \quad (10)$$

Similarly, if the input resistor has an infinite value, the stability factor is expressed as:

$$K = \frac{g_{11}\left(\frac{1}{R_2} + g_{22}\right) - Re(y_{12}y_{21})}{|y_{12}y_{21}|} \quad (11)$$

To determine the stability factor K, which in turn is determined by the values of $R_1$ and $R_2$, and the maximum stable gain (MSG) of transistor 12 or 41, maximum stable gain is represented as:

$$MSG = \left|\frac{y_{21}}{y_{12}}\right| = \left|\frac{s_{21}}{s_{12}}\right| \quad (12)$$

The impedances of tuned matching networks 25 and 32 to source 24 and load 31 are determined in accordance with:

$$Z_{IN} = \frac{Z_0(1 + \Gamma_{IN})}{1 - \Gamma_{IN}} \quad (13)$$

$$Z_{OUT} + \frac{Z_0(1 + \Gamma_{OUT})}{1 - \Gamma_{OUT}}$$

where $Z_0$ = the characteristic impedance of each of matching networks 25 and 32, in turn equal to the impedances of source 24 and load 31, $$\Gamma_{IN} = C_1* \left[ \frac{B_1 - \sqrt{B_1^2 - 4|C_1|^2}}{2|C_1|^2} \right] \quad (14)$$

$$\Gamma_{OUT} = C_2* \left[ \frac{B_2 - \sqrt{B_1^2 - 4|C_2|^2}}{2|C_2|^2} \right]$$

$C_1 = S_{11} - DS_{22}*$ $C_2 = S_{22} - DS_{11}*$ $D = S_{11}S_{22} - S_{12}S_{21}$ $B_1 = 1 + |S_{11}|^2 - |S_{22}|^2 - |D|^2$ $B_2 = 1 + |S_{22}|^2 - |S_{11}|^2 - |D|^2$ $C_1*$ and $C_2*$ are respectively complex conjugates of $C_1$ and $C_2$;
$S_{11}*$ and $S_{22}*$ are respectively complex conjugates of $S_{11}$ and $S_{22}$;
$S_{11}$ = the reflection coefficient between terminals 17 and 16 or between terminals 145 and 46, i.e., the reflection of the amplifier element between the emitter and base thereof in combination with the shunt resistor therefor;
$S_{22}$ = the reflection coefficient between terminals 18 and 16 or between terminals 47 and 46, i.e., between the collector and emitter electrodes 15 and 13, in combination with resistor 22, or between collector electrode 44 and base electrode 43 in combination with resistor 50;
$S_{12}$ = the reverse transmission coefficient of package 11 between terminals 17 and 18 or of package 142 between terminals 145 and 47; and
$S_{21}$ = the forward transmission coefficient of package 11 between terminals 18 and 17 or between terminals 47 and 145 of package 142.

Thus, $|S_{12}|^2$ is the reverse insertion power gain between terminals 17 and 18 of package 11 or between terminals 145 and 47 of package 142. $|S_{21}|^2$ is the forward insertion power gain of package 11 between terminals 17 and 18 or of package 142 between terminals 145 and 47. $\angle S_{12}$ is the reverse insertion phase shift of package 142 between terminals 47 and 145. $\angle S_{21}$ is the forward insertion phase shift of package 11 between terminals 17 and 18 or of package 142 between terminals 145 and 47.

From the values of $Z_{IN}$ and $Z_{OUT}$, the dimensions of matched tuning networks 25 and 32 are determined for the frequency band of source 24. $Z_{IN}$ and $Z_{OUT}$ are likely to be complex quantities representing series and shunt impedances which are established by distributed parameter properties of strip line transmission lines 25 and 32.

Figures 3, 6:
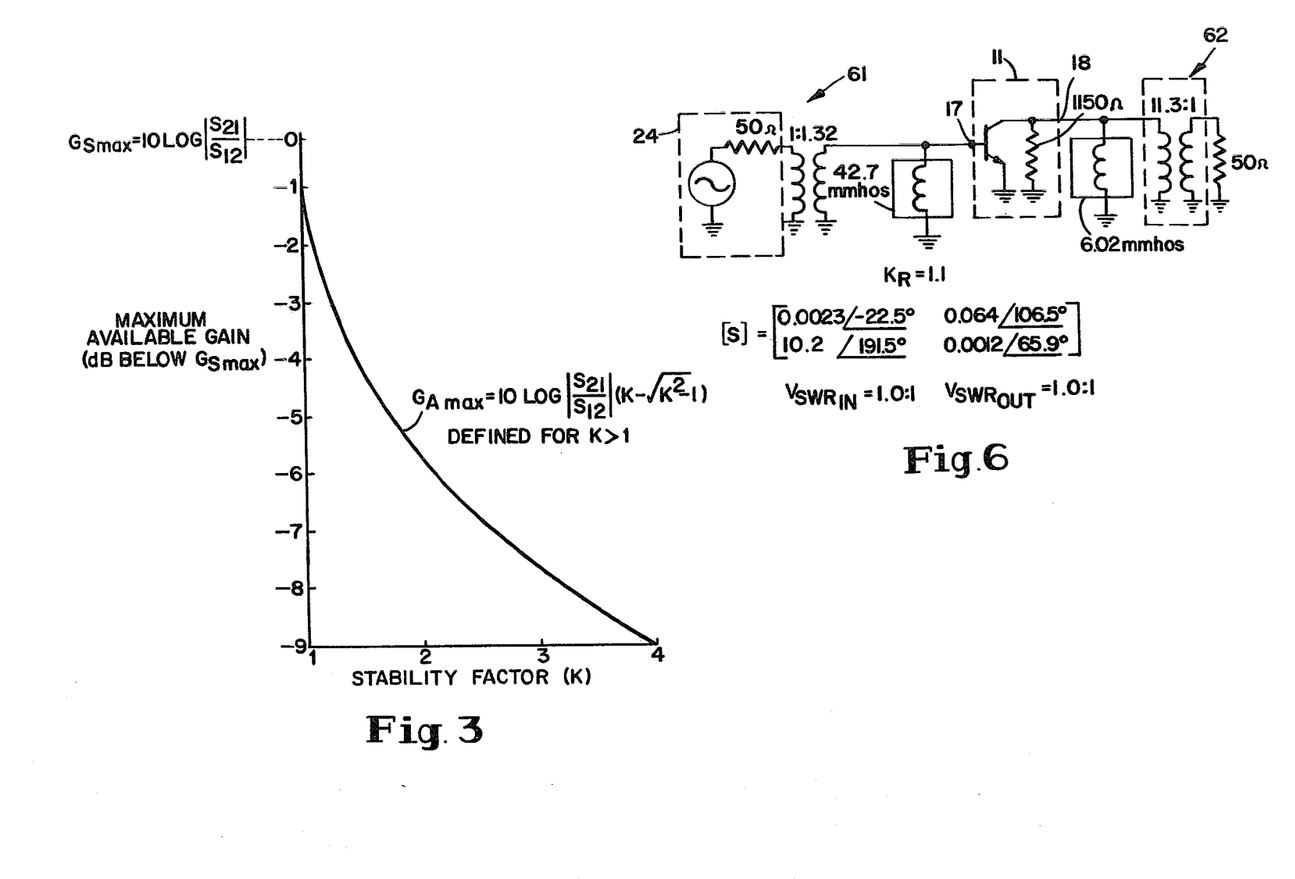
FIG. 3 is a plot of maximum available gain versus stability of the device illustrated in FIG. 1.
FIG. 6 is a circuit diagram of an idealized transistor circuit with assumed perfect matching transformers, designed in accordance with the criteria of the present invention.

The method of designing a microwave class A semiconductor so it has a desired gain, is matched to a microwave source and to a microwave load, in accordance with one aspect of the invention is described in connection with FIGS. 3–6. FIG. 3 is a plot of maximum available gain, $G_{AMAX}$, i.e., desired gain, versus stability factor, K. The plot of $G_{AMAX}$ is referenced against maximum stable gain, $G_{SMAX}$, of active element 12 or 41, without the shunt stabilizing resistors 21 and 22 or 48 and 50. The variable $G_{AMAX}$ is plotted in terms of dB below $G_{SMAX}$, which is equal to:

$10 \log|(s_{21}/s_{12})|$, where $s_{21}$ and $s_{12}$
are the forward and reverse transmission coefficients of transistor 12 or transistor 41, without the shunt stabilizing resistors 21 and 22 or 48 and 50.

Figure 4:
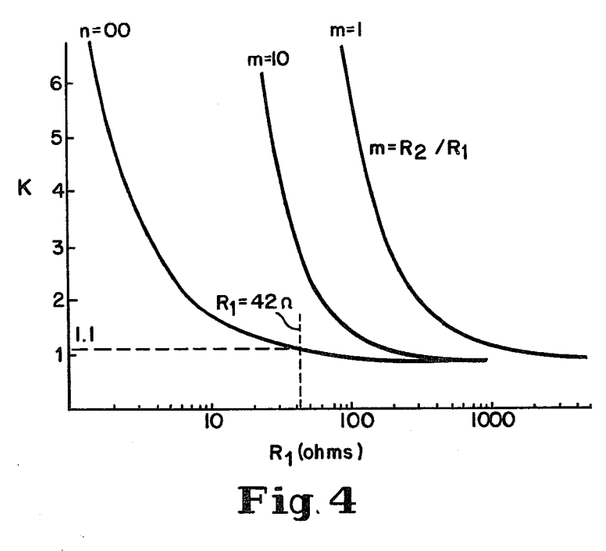
FIG. 4 is a plot of stability factor versus input shunt resistance for various ratios of output to input shunt resistors for the circuit illustrated in FIG. 1.
Figure 5:
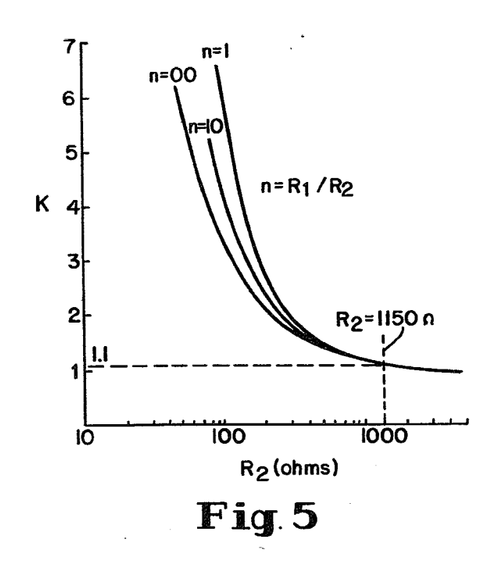
FIG. 5 is a plot of stability factor versus output shunt resistance for various ratios of input to output shunt resistors for the circuit of FIG. 1.

After the stability factor K has been determined from FIG. 3, the values of $R_1$ and $R_2$, the shunt stabilizing resistors 21 or 48 and 22 or 50 are determined from either or both of FIGS. 4 and 5. FIG. 4 is a plot of stability factor K versus shunt resistor 21 or 48, in logarithmic scale for various values of $M = (R_2/R_1)$; in particular, for the ratios $M = 1$, 10 and infinity. FIG. 5 is a similar plot of stability factor versus shunt resistor 22 or 50 in logarithmic terms for various values of $N = (R_1/R_2)$; in particular for $N = 1$, 10 and infinity. The plots on FIGS. 4 and 5 are calculated from:

$$K = \frac{\left(\frac{1}{R_1} + g_{11}\right)\left(\frac{1}{R_2} + g_{22}\right) - Re(y_{12}y_{21})}{|y_{12}y_{21}|} \quad (15)$$

where:

$g_{11}$ and $g_{22}$ are respectively the conductances between the base 14 and emitter 13 or between the emitter and base 42 and 43, and between the collector and base 44 and 43, without the stabilizing resistors 21, 22, 48 and 50;

$y_{21}$ is the forward transfer admittance of transistor 12 or transistor 41 without the shunt stabilizing resistors; and $y_{12}$ is the reverse transfer admittance of transistor 12 or transistor 41 without the shunt stabilizing resistors.

The curves illustrated in FIGS. 4 and 5 are the actual curves for the Hewlett Packard HXTR-6101 at a frequency of 1 gigahertz. From the value of K, as determined from FIG. 3, FIG. 4 and/or FIG. 5 is used to determine the values of $R_1$ and $R_2$.

After the values of $R_1$ and $R_2$ are determined from FIGS. 3 and 4 and/or 5, the scattering parameters of the device within package 11 or within package 142 are determined using known matrix analysis techniques. The modified scattering parameters are specified by $S_{12}$, $S_{21}$, $S_{11}$ and $S_{22}$. After the modified scattering parameters have been determined, the impedance values of input and output tuned matching networks 25 and 32 are calculated, as described supra.

Consideration is now given to a specific example of a circuit constructed in accordance with the present invention. It is assumed that each of source 24 and load 31 has a 50 ohm impedance and transistor 12 is a Hewlett Packard HXTR-6101, a low noise common emitter microwave bipolar transistor designed for minimum noise figure at 4 gigahertz. The transistor has a collector emitter DC bias $V_{CE}=10$ volts and a DC collector bias current $I_C=4$ milliamperes for class A, linear operation. The maximum stable gain of such a transistor, operating at 1 gigahertz, is 22 dB, where it has a stability factor of 0.877, indicating conditional stability, i.e., potentially unstable. It is desired to provide values for shunt resistors 21 and 22 and for matched, tuned impedances 25 and 32 so that the device, with the stabilizing resistors, has a gain of 20 dB and unconditional stability at 1 gigahertz.

The scattering parameters $S_{11}$, $S_{12}$, $S_{21}$ and $S_{22}$ are converted into transistor admittance parameters $y_{11}$, $y_{12}$, $y_{21}$ and $y_{22}$ utilizing standard techniques to yield the following results:

$S_{11} = 0.579 < -1110°$    $S_{12} = 0.034 < 22°$
$S_{21} = 5.46 < 107°$    $S_{22} = 0.772 < -22°$
$y_{11} = 0.024 < 63.7°$    $y_{12} = 0.0007 < 246.5°$
$y_{21} = 0.117 < 331.5°$    $y_{22} - 0.0037 < 84.4°$.

From the value of MSG and the values of $S_{21}$ and $S_{12}$, the graph of FIG. 3 is constructed. From FIG. 3, a gain of 20 dB, 2 dB below MSG=22 dB, is realized with a value of K=1.1. The value of K=1.1 is projected on both FIGS. 4 and 5. In FIG. 4, the value of K=1.1 intersects several different M characteristic lines. In FIG. 5, however, the value of K=1.1 intersects all of the plotted N values. One intersection point in FIG. 5 is for the value of $R_2=1150$ ohms. Because all of the K versus $R_2$ curves are bunched together in FIG. 5, $R_2$ has the greatest effect on K and it is therefore preferable to use $R_2$ alone to stabilize transistor 12. Hence, the curve $N=\infty$ is selected, whereby $R_1$ has an infinite value and can be represented as an open circuit between base 14 and emitter 13.

The scattering parameters of the modified circuit including transistor 12, and an 1150 ohm value for resistor 22, are then determined utilizing standard techniques, whereby $S_{11}=0.581\angle -109.7°$, $S_{12}=0.033\angle 22.4°$, $S_{22}=0.709\angle -22.3°$, and $S_{21}=5.26\angle 107.4°$. The maximum available gain, $G_{AMAX}$, and stability factor, K, for the complete device with the calculated scattering parameter values are determined utilizing standard techniques as: $G_{AMAX}=20.16$ db and $K=1.09$. Because K is greater than 1, the network is unconditionally stable at a frequency of 1 GHz. The scattering parameters of the modified circuit, including transistor 12 and an 1150 ohm value for resistor 22, are then determined at frequency intervals over the range of frequencies that the transistor 12 has unity gain or more. Since K is greater than unity, as calculated at each frequency, the modified transistor is shown to be unconditionally stable at all frequencies where the s-parameters are known. It is customary to design the bias network to provide resistive stabilization at frequencies from DC to the lowest frequency that s-parameters were measured.

From these scattering parameters, the impedance of input, tuned matching network 25 is calculated as having a conductance $g_{sm}=15.1$ millimhos and a susceptance $b_{sm}$ of $-42.7$ millimhos. Output tuned matching network 32 is calculated as having a conductance $g_{lm}=1.77$ millimhos and a susceptance of $b_{lm}=-6.22$ millimhos. Hence, the impedance of input network 25, $Z_{IN}=(7.37+j20.8)$ ohms, while the impedance of output network 32, $Z_{OUT}=(42.4+j148.8)$ ohms. The values of $Z_{IN}$ and $Z_{OUT}$ are calculated from the modified device scattering parameters $S_{11}$, $S_{12}$, $S_{21}$ and $S_{22}$ as described supra.

Thus to provide an amplifier with an HXTR-6101 transistor operating in the common emitter mode at 1 gigahertz and a gain of 20 dB, in accordance with the present invention, load and source conductances of 1.77 and 15.1 millimhos are respectively required. As illustrated in FIG. 6, these parameters can be attained by employing ideal input and output transformers 61 and 62, respectively connected between 50 ohm source 24 and terminal 17 of package 11, and between 50 ohm load 31 and terminal 18 of package 11. Package 11 in FIG. 6 is identical to package 11 in FIG. 1, but the value of resistor 21 in infinite, and DC blocking capacitor 23 is omitted, as are other bias connections. Transformers 61 and 62 respectively have turns ratios of 1:1.32 and 11.3:1 to transform the characteristic 50 ohm impedances of source 24 and load 31 into the required conductances. Shunt indicators 63 and 64, respectively shunting the base and collector of terminals 17 and 18 to ground, supply the required source and load susceptances of $-42.7$ millimhos and $-6.22$ millimhos.

It can be shown that the s-parameters of the entire network illustrated in FIG. 6 are: $S'_{11}=0.0023\angle -22.5°$, $S'_{12}=0.064\angle 106.5°$, $S'_{21}=10.2\angle 191,5°$ and $S'_{22}=0.0012\angle 65.9°$. The values of both $S'_{11}$ and $S'_{22}$ are quite small to approximate 0, a result which occurs because the source and load are simultaneously conjugately matched by the present invention. The quantity which represents the maximum available gain of the entire network, including the matching network and shunt stabilizing resistor, is 20.16, approximately equal to the maximum stable gain of transistor amplifier 12 within package 11, without any shunt stabilizing resistors. The stability factor, K, of the entire network equals 1.09, the same as the stability factor of the entire device within package 11, i.e., transistor 12 in combination with the shunt stabilizing resistors. Hence, the network is unconditionally stable, even though the input and output have been matched, in contrast to the prior art techniques.

While there have been described and illustrated two specific embodiments of the invention, it will be clear that variations in the details of the embodiments specifically described and illustrated may be made without departing from the true spirit and scope of the invention as defined in the appended claims.

1. An amplifier for feeding a microwave signal source to a load matched to the source comprising a microwave semiconductor amplifying element having input, output and common electrodes, a first tuned matching network connected between the source and input electrode, a second tuned matching network connected between the load and output electrode, means for supplying bias voltage to the amplifying element, resistor means connected in shunt with at least one of the input and output electrodes and the common electrode, the value of the resistor means being selected to assure unconditional stability of the semiconductor amplifying element.

2. The amplifier of claim 1 further including blocking capacitor means in series with the resistor means for preventing the flow of bias current through the resistor means without affecting current flowing from the source through the resistor means.

3. The amplifier of claim 1 wherein the resistor means includes a first resistor connected in shunt with the input and commom electrodes, and a second resistor connected in shunt with the output and common electrodes, the ratio of the resistors providing the unconditional stability.

4. The amplifier of claim 3 further including first and second capacitors respectively in series with the first and second resistors for preventing the flow of bias current through the first and second resistors without affecting current flowing from the source through the first and second resistors.

5. The amplifier of claim 3 wherein the values of the first and second resistors ($R_1$ and $R_2$ respectively) are related to the input conductance $g_{11}$ of the element between the input and common electrodes thereof, the output conductance $g_{22}$ of the element between the output and common electrodes thereof, the forward transfer admittance $y_{21}$ of the element from the input to the output electrodes thereof, the reverse transfer admittance $y_{12}$ of the element from the output to the input electrodes thereof, and to a stability factor K for the element and shunt resistors by $$K = \frac{\left(\frac{1}{R_1} + g_{11}\right)\left(\frac{1}{R_2} + g_{22}\right) - Re(y_{12}y_{21})}{|y_{12}y_{21}|}$$

so that K is greater than one.

6. The amplifier of claim 5 wherein the values of $R_1$, $R_2$, $y_{21}$ and $y_{12}$ cause K to equal a value for desired maximum available gain ($G_{AMAX}$) in accordance with $$G_{AMAX} = \left|\frac{y_{21}}{y_{12}}\right| |K - \sqrt{K^2 - 1}|.$$

7. The amplifier of claim 1 or claim 2 or claim 3 or claim 4 or claim 5 wherein the element and the resistor means are enclosed in a common package having three output terminals respectively connected to the three electrodes of the element.

8. The amplifier of claim 3 or claim 4 or claim 5 wherein the first and second resistors respectively have values to provide relatively high efficiency and low noise characteristics for the element.

9. The amplifier of claim 1 wherein the resistor means consists of a resistor having a value of $R_1$ shunting the input and common electrodes, the value of $R_1$ being related to the input conductance $g_{11}$ of the element between the input and common electrodes thereof, the output conductance $g_{22}$ of the element between the output and common electrodes thereof, the forward transfer admittance $y_{21}$ of the element from the input to the output electrodes thereof, the reverse transfer admittance $y_{12}$ of the element from the output to the input electrodes thereof, and to a stability factor K for the element and shunt resistors by $$K = \frac{\left(\frac{1}{R_1} + g_{11}\right)g_{22} - Re(y_{12}y_{21})}{|y_{12}y_{21}|}$$

so that K is greater than one.

10. The amplifier of claim 1 wherein the resistor means consists of a resistor having a value of $R_2$ shunting the output and common electrodes, the value of $R_2$ being related to the input conductance $g_{11}$ of the element between the input and common electrodes thereof, the output conductance $g_{22}$ of the element between the output and common electrodes thereof, the forward transfer admittance $y_{21}$ of the element from the input to the output electrodes thereof, the reverse transfer admittance $y_{12}$ of the element from the output to the input electrodes thereof, and to a stability factor K for the element and shunt resistors by $$K = \frac{g_{11}\left(\frac{1}{R_2} + g_{22}\right) - Re(y_{12}y_{21})}{|y_{12}y_{21}|}$$

so that K is greater than one.

11. The amplifier of claim 1 or claim 2 or claim 3 or claim 4 or claim 5 or claim 9 or claim 10 wherein the source amplitude as coupled to the input electrode and the bias means are such that the element has linear class A operation.

12. The amplifier of claim 1 or claim 3 or claim 5 or claim 9 or claim 10 wherein the first matching network has an impedance to the source ($Z_{IN}$) in accordance with $$Z_{IN} = \frac{Z_0(1 + \Gamma_{IN})}{(1 + \Gamma_{IN})}$$

and the second matching network has an impedance to the load ($Z_{OUT}$) in accordance with $$Z_{OUT} = \frac{Z_0(1 + \Gamma_{OUT})}{(1 - \Gamma_{OUT})}$$

where:

$Z_0$ = the characteristic impedance of the first matching network = the characteristic impedance of the second matching network, $$\Gamma_{IN} = C_1 * \left[ \frac{B_1 - \sqrt{B_1{}^2 - 4|C_1|^2}}{2|C_1|^2} \right]$$

$$\Gamma_{OUT} = C_2 * \left[ \frac{B_2 - \sqrt{B_2{}^2 - 4|C_2|^2}}{2|C_2|^2} \right]$$

$C_1 = S_{11} - DS_{22}*$ $C_2 = S_{22} - DS_{11}*$ $D = S_{11}S_{22} - S_{12}S_{21}$ $B_1 = 1 + |S_{11}|^2 - |S_{22}|^2 - |D|^2$ $B_2 = 1 + |S_{22}|^2 - |S_{11}|^2 - |D|^2$ $C_1*$ and $C_2*$ are respectively complex conjugates of $C_1$ and $C_2$ $S_{11}*$ and $S_{22}*$ are respectively complex conjugates of $S_{11}$ and $S_{22}$ $S_{11}$ and $S_{22}$ are respectively reflection coefficients of the element and resistor means between the input and common electrodes and between the output and common electrodes, $S_{12}$ and $S_{21}$ are respectively the reverse and forward transmission coefficients of the element and resistor means, whereby $|S_{12}|^2$ and $|S_{21}|^2$ are respectively reverse and forward insertion power gains of the element and resistor means, and $\angle S_{12}$ and $\angle S_{21}$ are respectively reverse and forward insertion phase shifts of the element and resistor means.

13. A class A microwave amplifier comprising an active microwave semiconductor element having input, output and common electrodes, resistor means connected in shunt with at least one of the input and output electrodes and the common electrode, the value of the resistor means being selected to assure unconditional stability of the semiconductor amplifying element, and blocking capacitor means in series with the resistor means for preventing the flow of bias current through the resistor means without affecting current flowing from the source through the resistor means.

14. The amplifier of claim 13 wherein the resistor means includes a first resistor connected in shunt with the input and common electrodes, and a second resistor connected in shunt with the output and common electrodes, the ratio of the resistors providing the unconditional stability.

15. The amplifier of claim 14 wherein the values of the first and second resistors ($R_1$ and $R_2$ respectively) are related to the input conductance $g_{11}$ of the element between the input and common electrodes thereof, the output conductance $g_{22}$ of the element between the output and common electrodes thereof, the forward transfer admittance $y_{21}$ of the element from the input to the output electrodes thereof, the reverse transfer admittance $y_{12}$ of the element from the output to the input electrodes thereof, and to a stability factor K for the element and shunt resistors by $$K = \frac{\left(\frac{1}{R_1} + g_{11}\right)\left(\frac{1}{R_2} + g_{22}\right) - Re(y_{12}y_{21})}{|y_{12}y_{21}|}$$

so that K is greater than one.

16. A class A microwave amplifier comprising an active microwave semiconductor element having input, output and common electrodes, resistor means connected in shunt with at least one of the input and output electrodes and the common electrode, the value of the resistor means being selected to assure unconditional stability of the semiconductor amplifying element, wherein the resistor means includes a first resistor connected in shunt with the input and common electrodes, and a second resistor connected in shunt with the output and common electrodes, the ratio of the resistors providing the unconditional stability, and first and second capacitors respectively in series with the first and second resistors for preventing the flow of bias current through the first and second resistors without affecting current flowing from the source through the first and second resistors.

17. The amplifier of claim 13 or claim 14 or claim 16 or claim 15 wherein the element and the shunt resistor means are enclosed in a common package having three output terminals respectively connected to the three electrodes of the element.

18. The amplifier of claim 14 or claim 16 or claim 15 wherein the first resistors respectively have values to provide relatively high efficiency and low noise characteristics for the element.

19. A class A microwave amplifier comprising an active microwave semiconductor element having input, output and common electrodes, resistor means connected in shunt with at least one of the input and output electrodes and the common electrode, the value of the resistor means being selected to assure unconditional stability of the semiconductor amplifying element, wherein the resistor means consists of a resistor having a value $R_1$ shunting the input and common electrodes, the value of $R_1$ being related to the input conductance $g_{11}$ of the element between the input and common electrodes thereof, the output conductance $g_{22}$ of the element between the output and common electrodes thereof, the forward transfer admittance $y_{21}$ of the element from the input to the output electrodes thereof, the reverse transfer admittance $y_{12}$ of the element from the output to the input electrodes thereof, and to a stability factor K for the element and shunt resistors by $$K = \frac{\left(\frac{1}{R_1} + g_{11}\right) g_{22} - Re(y_{12}y_{21})}{|y_{12}y_{21}|}$$

so that K is greater than one.

20. A class A microwave amplifier comprising an active microwave semiconductor element having input, output and common electrodes, resistor means connected in shunt with at least one of the input and output electrodes and the common electrode, the value of the resistor means being selected to assure unconditional stability of the semiconductor amplifying element, wherein the resistor means consists of a resistor having a value $R_2$ shunting the input and common electrodes, the value of R₂ being related to the input conductance $g_{11}$ of the element between the input and common electrodes thereof, the output conductance $g_{22}$ of the element between the output and common electrodes thereof, the forward transfer admittance $y_{21}$ of the element from the input to the output electrodes thereof, the reverse transfer admittance $y_{12}$ of the element from the output to the input electrodes thereof, and to a stability factor K for the element and shunt resistors by $$K = \frac{g_{11}\left(\frac{1}{R_2} + g_{22}\right) - Re(y_{12}y_{21})}{|y_{12}y_{21}|}$$

so that K is greater than one.

21. A class A microwave amplifier comprising an active microwave semiconductor element having input, output and common electrodes, resistor means connected in shunt with at least one of the input and output electrodes and the common electrode, the value of the resistor means being selected to assure unconditonal stability of the semiconductor amplifying element, the element and the shunt resistor being enclosed in a common package having three output terminals respectively connected to the three electrodes of the element.

* * * * *